United States Patent [19]
Liu et al.

[11] Patent Number: 5,823,964
[45] Date of Patent: Oct. 20, 1998

[54] ULTRASOUND DOPPLER WALL FILTER

[75] Inventors: Dong-Chyuan Liu, Mercer Island, Wash.; Ja-Il Koo, Phoenix, Ariz.

[73] Assignee: Siemens Medical Systems, Inc., Iselin, N.J.

[21] Appl. No.: 777,496

[22] Filed: Dec. 30, 1996

[51] Int. Cl.⁶ .................................................. A61B 8/06
[52] U.S. Cl. ........................................................ 600/454
[58] Field of Search ........................... 128/661.07–661.1, 128/660.01; 73/861.25; 600/454–458, 437

[56] References Cited

U.S. PATENT DOCUMENTS

| | | | |
|---|---|---|---|
| 5,327,894 | 7/1994 | Thomas | 128/661.09 |
| 5,349,524 | 9/1994 | Daft et al. | 128/661.09 |
| 5,349,525 | 9/1994 | Dunki-Jacobs et al. | 128/661.09 |
| 5,419,333 | 5/1995 | Hagiwara et al. | 128/661.09 |
| 5,467,770 | 11/1995 | Smith et al. | 128/661.08 |

OTHER PUBLICATIONS

Chornoboy, E.S., "Initialization For Improved IIR Filter Performance,"0 *IEEE Transactions On Signal Processing,* 40(3):543–550, Mar. 1992.

*Primary Examiner*—Francis Jaworski

[57] ABSTRACT

An improved digital wall filter comprises an infinite impulse response (IIR) second order digital filter. The coefficients $w(-1)$ and $w(-2)$ are pre-initialized from a set of m samples of the input signal. The number of samples m is related to the ratio of a constant $\gamma$, selected between 0 and 1, and the feedback filter coefficients. To ensure maximum performance of the filter, the filter is periodically re-initialized before filtering a new set of input data. To produce a video line, the filtered data created from the input samples used to initialize the filter are averaged with data that was not used to initialize the filter.

6 Claims, 6 Drawing Sheets

ULTRASOUND DOPPLER WALL FILTER

FIELD OF THE INVENTION

The present invention relates to ultrasound imaging systems, and in particular to digital filters that remove low frequency artifacts from Doppler ultrasound images.

BACKGROUND OF THE INVENTION

Ultrasound is becoming an increasingly used method of noninvasively examining interior body matter of a patient. An ultrasound system operates by transmitting high-frequency acoustic signals into the patient's body and detecting and analyzing the returned echoes. Most ultrasound systems operate in an imaging or B-mode that provides the physician or sonographer with an image of the tissue under examination as well as in a Doppler mode. In the Doppler mode, an image is created that represents the velocity of moving body matter, such as blood flow. The velocity of the moving body matter is indicative of a variety of health conditions such as cardiovascular disease, arterial blockages, etc.

Doppler ultrasound works by detecting a frequency shift in the returned echo signals compared to the frequency of the signals applied to the body. The returned echo signals are spectrally analyzed using a fast fourier transform (FFT) or equivalent signal processing technique. The spectra produced by the FFTs are plotted versus time to produce the Doppler spectrum image.

In practice, many Doppler images contain low-frequency, high intensity artifacts that are typically caused by moving muscle or artery walls. These artifacts interfere with the ability of the physician to diagnose the tissue under examination.

The traditional way of removing clutter from a Doppler spectrum image is with a digital wall filter. However, current filter designs have not proven entirely successful in removing the low-frequency artifacts from a Doppler image. Therefore, there is a need for a digital wall filter having a sharp cut-off frequency, good stability and transient response that can be optimized to remove low-frequency artifacts from a Doppler ultrasound image.

SUMMARY OF THE INVENTION

The present invention is an improved digital wall filter that eliminates low frequency artifacts from a Doppler ultrasound image. The digital wall filter is a second or higher order infinite impulse response (IIR) filter wherein the initial values of the filter $w_k(-1)$ and $w_k(-2)$ are precomputed to reduce the transient response of the filter. The initial values are computed using m initial values of the input signal wherein the value m is related to the level of acceptable ripple of the filter and the filter coefficients.

Because the filter is initialized from a series of samples of the input signal, it will not perform optimally for an indefinite period of time. Therefore, the filter must be periodically re-initialized. Three embodiments of the invention are described whereby the filter is re-initialized for each fast fourier transform to be computed. Alternatively, the filter can be re-initialized after each video line in the Doppler image is produced. Finally, the filter can be re-initialized upon receipt of each block of Vsync data from an input stage of the ultrasound system.

Because the spectra obtained from the samples used to initialize the filter are more accurate than those obtained with subsequent data, all the spectra used to create a video line in the Doppler image are averaged. In the presently preferred embodiment of the invention, a weighted logarithmic averaging process is used to emphasize the spectra obtained with the data used to initialize the digital wall filter.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention is a digital filter that is optimized to remove low-frequency artifacts from a Doppler ultrasound image.

Figure 1A:
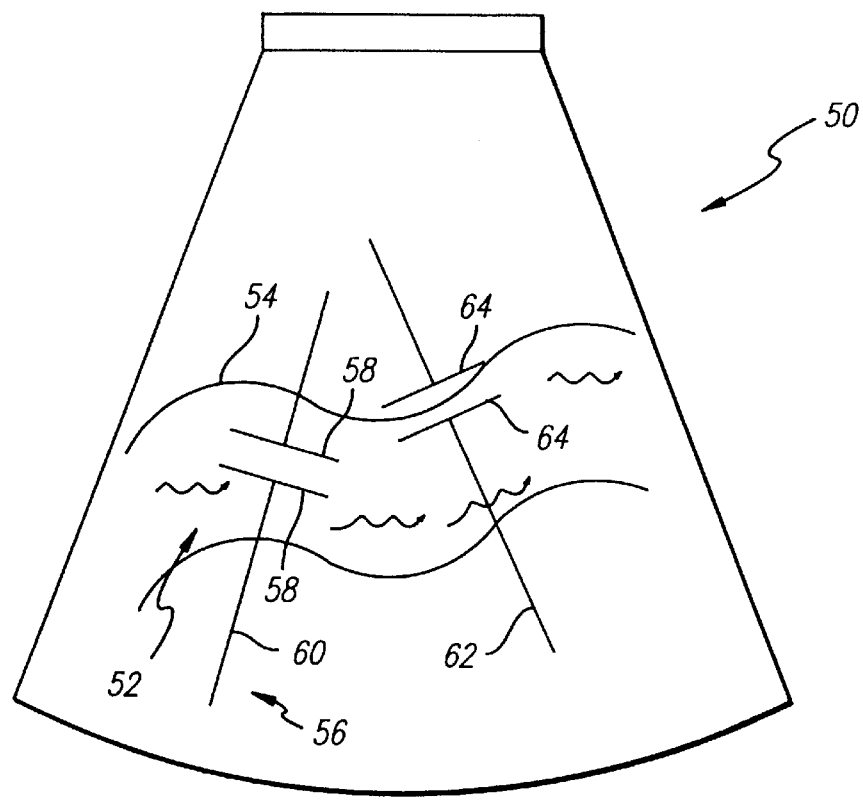
FIG. 1A illustrates how a Doppler ultrasound image is created.

FIG. 1A shows a typical B-mode ultrasound image that is created by an ultrasound system and displayed to a physician or sonographer. The image 50 comprises a two-dimensional picture of the internal body matter of the patient. In the example shown, the body matter includes an artery having an amount of blood 52 flowing through it. To create a Doppler image, a user positions a range gate somewhere within the ultrasound image. The range gate limits the echo signals that are used to create the Doppler image to those that originate at a particular depth in the tissue. For example, a range gate 56 includes a pair of parallel lines 58 that are moveable along a straight line 60. The position of the parallel lines 58 in the image defines the depth from which the Doppler ultrasound signals will be obtained. In the range gate 56, the parallel lines 58 are positioned to collect echo signals that originate within the interior of the artery and away from any artery wall, thereby causing the ultrasound system to produce a Doppler image without wall artifacts.

In contrast, a second range gate 62 is shown having a pair of parallel lines 64 that are positioned over a portion of an artery wall 54. As indicated above, the artery wall 54 moves in response to the cardiac cycle and produces low-frequency, high-intensity signals that create artifacts in a corresponding Doppler image. While it is possible to reduce the clutter effect in the image by carefully positioning the range gate away from moving tissue, this is not always practical if it is desired to investigate the velocity of blood flowing at a position near an artery or tissue wall.

Figure 1B:
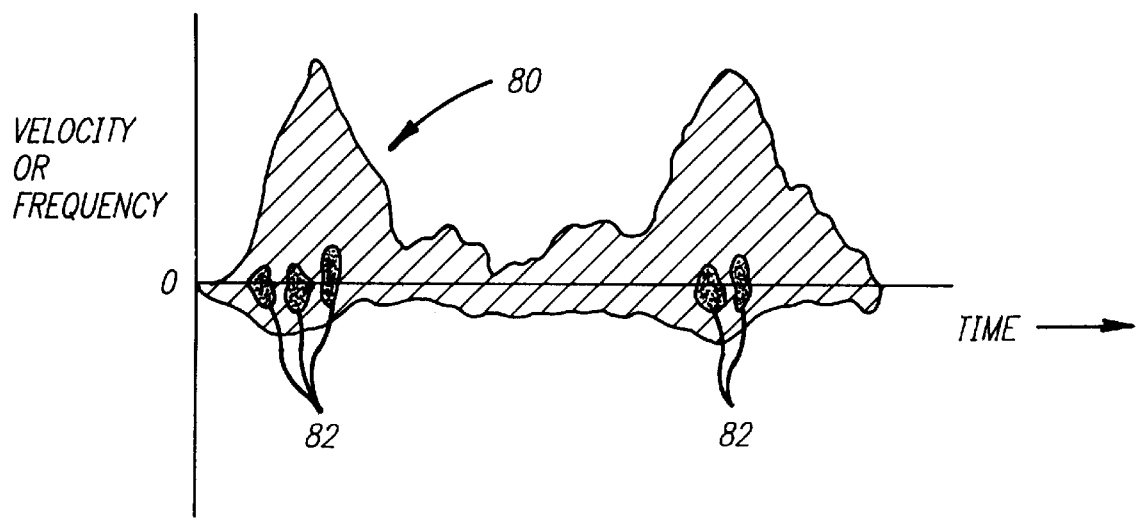
FIG. 1B illustrates a Doppler ultrasound image with wall artifacts.

FIG. 1B shows a typical Doppler ultrasound image that includes wall artifacts or clutter. The Doppler image is a graph 80 of the velocity of the moving blood flow versus time. Often the graph is color or brightness coded so that the greater the velocity of flow, the brighter that portion of the graph appears in the image. If the range gate is positioned so that echoes are received from a portion of the body that includes an artery or muscle wall, the Doppler image may include one or more wall artifacts. These artifacts appear as bright spots 82 on the Doppler image and impair the ability of the sonographer or physician to analyze the low velocity portion of the image. Therefore, it is generally desirable to remove these artifacts from the image through the use of an appropriate filter.

Figure 2A:
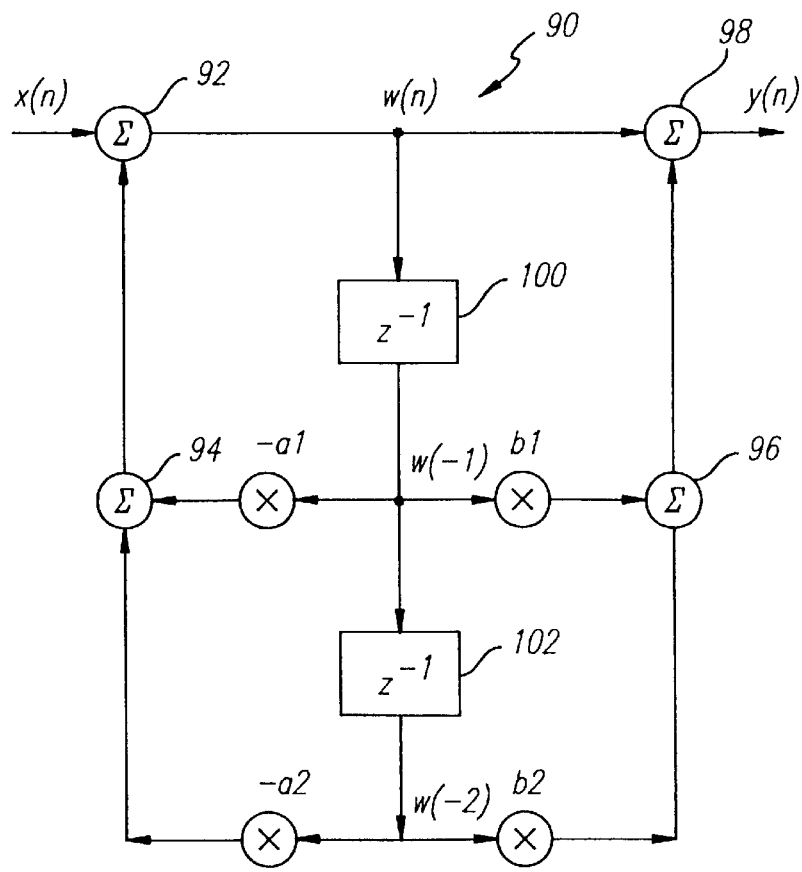
FIGS. 2A–2C illustrate three examples of prior art digital filters.
Figure 2B:
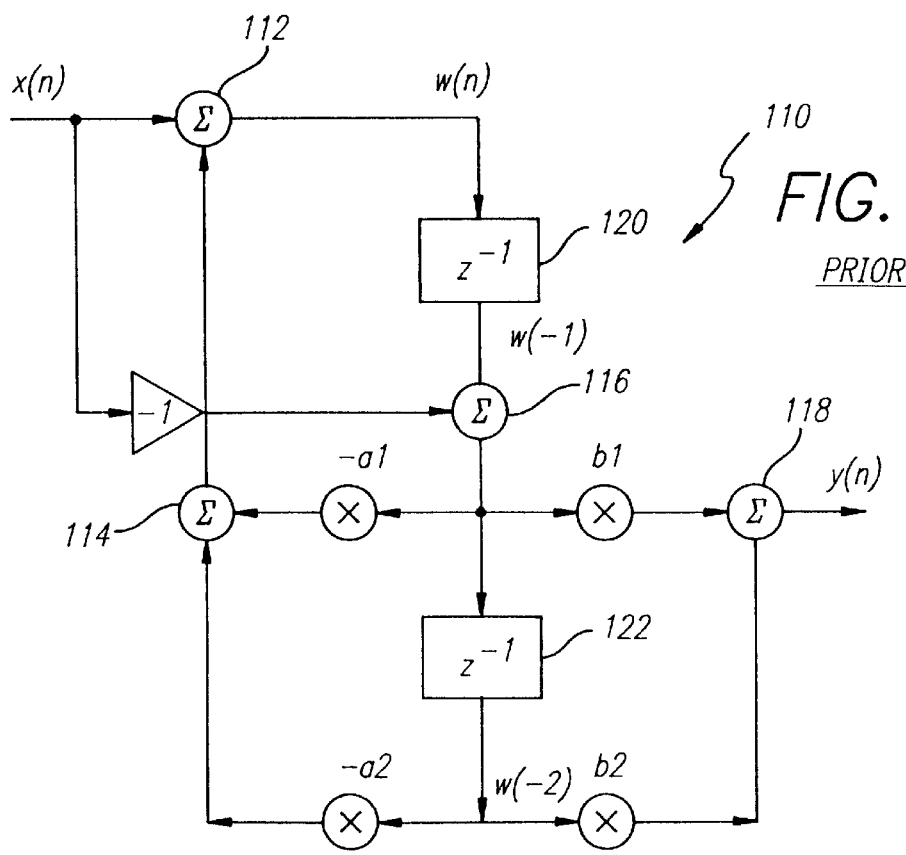
Figure 2C:
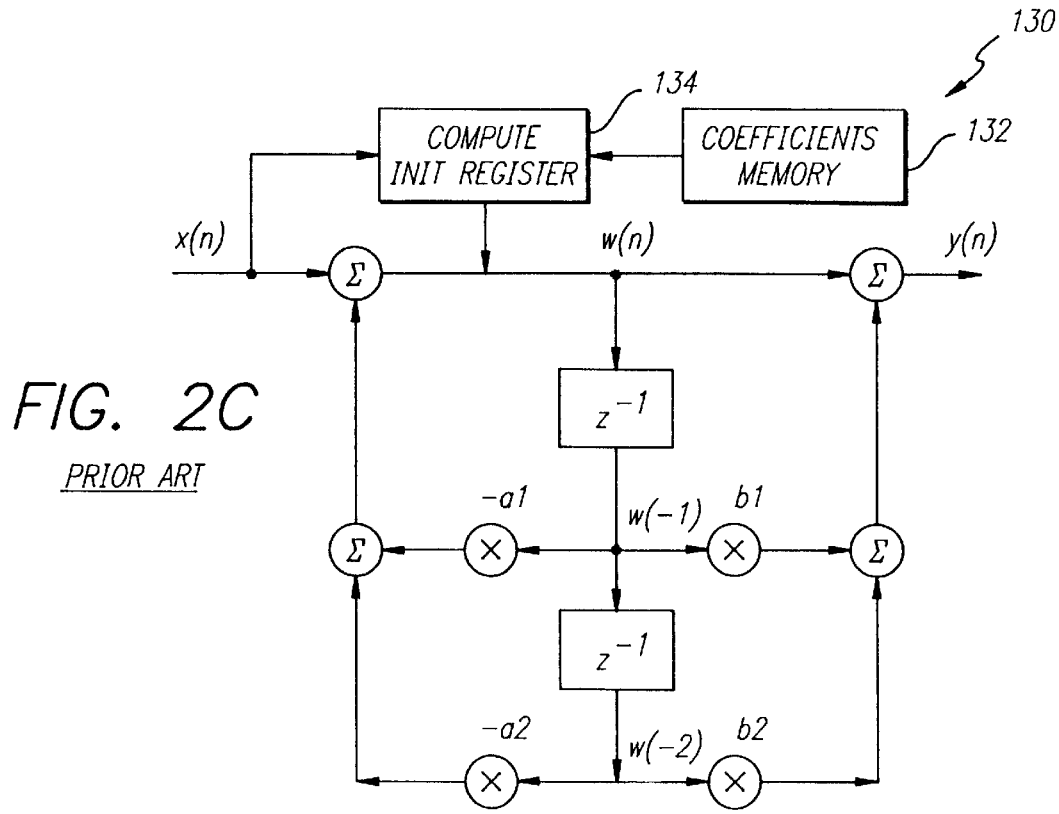

FIGS. 2A–2C illustrate a variety of prior art digital filter designs that have not proven completely successful in eliminating low-frequency wall artifacts. FIG. 2A shows a conventional second order infinite impulse response (IIR) digital filter 90. The digital filter can be represented as four summation blocks 92, 94, 96 and 98 and two delay blocks 100 and 102. The input signal x(n) is applied to an input of the summation block 92. The output of the summation block 92 is labeled w(n). Coupled to the another input of the summation block 92 is the output of the summation block 94. The summation block 94 sums the signal w(-1) (i.e., the signal w(n) delayed by one sample time in the delay block 100) and scaled by the coefficient $-a_1$ and the signal w(-2) (i.e., the signal w(-1) delayed by a sample time by the delay block 102) and scaled by the coefficient $-a_2$. The output signal of the filter, y(n), is produced at an output of the summation block 98 which adds the signal w(n) and the output of the summation block 96. The summation block 96 adds the signal w(-1) scaled by the coefficient $b_1$ and the signal w(-2) scaled by the coefficient $b_2$.

The operation of the IIR filter 90 shown in FIG. 2A is described by the following equations:

$$y(n)=w(n)+b_1w_1(n)+b_2w_2(n)$$

$$w(n)=x(n)-a_1w_1(n)-a_2w_2(n)$$

$$w_1(n)=w(n-1)$$

$$w_2(n)=w(n-1) \qquad (1)$$

where $w_1(n)$ is the same as w(-1) and $w_2(n)$ is the same as w(-2). The IIR filter 90 can be cascaded in multiple sections to produce a higher order filter. In which case, the filter is described by the equations:

$$w_k(n)=y_{k-1}(n)-a_{1k}w_k(n-1)-a_{2k}w_k(n-2)$$

$$y_k(n)=w_k(n)-b_{1k}w_k(n-1)-b_{2k}w_k(n-2) \qquad (2)$$

with the initialization of:

$$w_k(-1) = w_k(-2) = \begin{cases} \dfrac{Gc}{1+a_1+a_2} & \text{if } k=1 \\ 0 & \text{otherwise} \end{cases} \qquad (3)$$

where k is the number of cascaded filter sections and G is the gain of the filter. The constant c is chosen as the magnitude of the initial sample x(0). The values of the coefficients a and b are defined by the desired characteristics of the filter, namely its cut-off frequency, roll-off rate, ripple and phase characteristics. The method of selecting the coefficients a and b given the desired filter characteristics is considered well known to those of ordinary skill in the art.

When the filter shown in FIGURE 1A has a high order and a sharp cut-off frequency, the denominator of Equation 3 is nearly zero, making the values of w(-1) and w(-2) very large. To reduce the number of bits required to represent the w(-1) and w(-2) values, an improved IIR filter has been developed.

The improved filter 110 shown in FIG. 2B, can be represented as four summation blocks 112, 114, 116 and 118 as well as two delay blocks 120 and 122. The input signal, x(n), is applied to an input of the summation block 112. The output of the summation block 112 is labeled w(n). Coupled to a second input of the summation block 112 is the output signal of the summation block 114. The summation block 114 adds the output of the summation block 116 scaled by the coefficient $-a_1$, and the value w(-2) (which is the output of the summation block 116 delayed by one sample time in the delay block 122) scaled by the coefficient $-a_2$. The summation block 116 adds the signal w(-1) (i.e., the signal w(n) delayed by one sample time in the delay block 120) and the inverse of the input signal x(n). The output of the filter, y(n), is produced by the summation block 118 that adds the output of the summation block 116 scaled by the coefficient $b_1$ and the signal w(-2) scaled by the coefficient $b_2$.

The operation of the improved IIR filter 110 shown in FIG. 2B is described by the equations:

$$y(n)=b_1w_1(n)-b_1x(n)+w_2(n)$$

$$w(n)=x(n)-a_1[w_1(n)-x(n)]-a_2w_2(n)$$

$$w_1(n)=w(n-1)$$

$$w_2(n)=w_1(n-1)-x(n-1) \qquad (4)$$

If the filter is cascaded with k identical sections, its operation is defined by the equations:

$$w_k(n)=y_{k-1}(n)-a_{1k}[w_k(n-1)-y_{k-1}(n)]-a_{2k}[w_k(n-2)-y_{k-1}(n-1)]$$

$$y_k(n)=-b_{1k}w_k(n-1)+w_k(n-2)-y_{k-1}(n-1) \qquad (5)$$

with the initialization of:

$$y_{k-1}(-1) = w_k(-2) = 0 \qquad (6)$$

$$w_k(-1) = \begin{cases} Gc & \text{if } k=1 \\ 0 & \text{otherwise} \end{cases}$$

The coefficients $b_{1k}$ and $b_{2k}$ for the filter shown in FIG. 2B are -1 and 1, respectively, and the coefficients $a_{1k}$ and $a_{2k}$ of Equation 5 are the same as the filter coefficients $a_{1k}$ and $a_{2k}$ of Equation 2.

The IIR filters 90 and 110 shown in FIGS. 2A and 2B both suffer from poor transient response that degrades the filter performance. To combat this, an IIR filter 130 of the type shown in FIG. 2C was developed. This IIR filter has the same configuration as the IIR filter 90 shown in FIG. 2A, except that the filter 130 has a memory 132 that stores the filter coefficients $-a_1$, $-a_2$, $b_1$ and $b_2$. The data in the memory 132 is loaded into a processor 134 that receives a number of input samples x(n) in order to compute the values $w_k(-1)$ (i.e., the output of the delay block 100 at time t=0) and $w_k(-2)$ (i.e., the output of the delay block 102 at time t=0). These values are selected to minimize the transient response of the filter. As set forth in the article, "Chomoboy Initialization for Improved Filter Performance," *IEEE Transactions on Signal Processing* 40:543–550, 1992. This is referred to as a projection initialization method.

Given an input sign $x(n)=e^{j\omega n}u(n)$, the values of w(-1) and w(-2) are determined by separating the output of the filter into a transient component and a steady state component according to the equation:

$$y_{tr}(n) = -H_D(e^{j\omega})A^T \left[ I\delta(n) + r^{n-1}\frac{\sin n\theta}{\sin\theta} Bu(n-1) - r^{n-2}\frac{\sin(n-1)\theta}{\sin\theta} \beta_2 Iu(n-2) \right] \epsilon(e^{j\omega}) \quad (7)$$

where $$H_D(e^{j\omega}) = \frac{1}{(1-re^{j(\theta-\omega)})(1-re^{-j(\theta+\omega)})}$$

$$\epsilon(e^{j\omega}) = \begin{bmatrix} e^{-j\omega} \\ e^{-j2\omega} \end{bmatrix}$$

$$A \triangleq \begin{bmatrix} \alpha_1 - \alpha_0\beta_1 \\ \alpha_2 - \alpha_0\beta_2 \end{bmatrix}, B \triangleq \begin{bmatrix} -\beta_1 & -\beta_2 \\ 1 & 0 \end{bmatrix}$$

and I is the identity matrix. The values $\theta$ and r are determined from the filter poles $P = re^{\pm j\theta}$ and $\beta_1 = -2r\cos\theta$ and $\beta_2 = r^2$.

The initial values of the variables $w_k(-1|-2)$ at the section k of the cascading filter are computed according to the matrix product $$w_k(-1|-2) = M[1 \ldots 2k, 1 \ldots m]X[1 \ldots m] \quad (8)$$

where X is simply a column of the first m samples of the input signal x(n). The results of Equation 8 are loaded into the filter prior to its operation.

The matrix M has a dimension of 2s×m where s is the number of sections of the cascading filter and m is the number of samples used for initialization. The matrix M could be seen as a projection to the initial vector, $$M = -(F^T F)^{-1} F^T G \quad (9)$$

where $$F = [(\Pi_{i-2}{}^2 g_i)F_1, (\Pi_{i-3}{}^s G_i)F_2, \ldots G_s F_{s-1}, F_s]$$

$$G = \Pi_{i-1}{}^s g_i$$

and $$\Pi_{i-k}{}^{k2} G_i = G_{k_2} G_{k_2-1} \ldots G_{k_1}$$

Specifically, $F_i$ is the m×2 matrix in the section i, $$F_i = \begin{bmatrix} A_i^T \\ A_i^T B_i \\ \cdot \\ \cdot \\ \cdot \\ A_i^T B_i^{s-1} \end{bmatrix}$$

and $G_i$ is the m×m lower triangle matrix $$G_i = \begin{bmatrix} 1 & 0 & & 0 & 0 & 0 & 0 \\ A_i^T C_i & 1 & & 0 & 0 & 0 & 0 \\ A_i^T B_i C_i & A_i^T C_i & \cdot & 0 & 0 & 0 & 0 \\ \cdot & \cdot & \ldots & 1 & 0 & 0 & 0 \\ \cdot & \cdot & \cdot & A_i^T C_i & 1 & 0 & 0 \\ \cdot & \cdot & \cdot & A_i^T B_i C_i & A_i^T C_i & 1 & 0 \\ A_i^T B_i^{s-2} C_i & A_i^T B_i^{s-3} C_i & \cdot & a_i^T B_i^2 C_i & A_i^T B_i C_i & A_i^T C_i & 1 \end{bmatrix}$$

The coefficient matrices $A_i$, $B_i$ and $C_i$ are defined from the filter coefficients, $$A_i = \begin{bmatrix} b_{1i} - a_{1i} \\ b_{2i} - a_{2i} \end{bmatrix}, B_i = \begin{bmatrix} -a_{1i} & -a_{2i} \\ 1 & 0 \end{bmatrix}, C_i = \begin{bmatrix} 1 \\ 0 \end{bmatrix} \quad (10)$$

For a high-pass filter, the coefficients $b_{1i}, b_{2i}$ are constants at each section and equal to $-2$ and 1, respectively The matrix, M, of Equation 9 is completely predetermined by knowledge of the filter coefficients. Once an initialization vector has been computed, using Equation 8, the IIR filter can be implemented using standard methods, for example, the recursive equations of Equation 2.

While the filter shown in FIG. 2C has an improved transient response, it is still numerically unstable if operated with a high order and low cut-off frequency. Therefore the filter of the present invention combines the numerical stability of the filter shown in FIG. 2B with the improved transient response of the filter shown in FIG. 2C.

Figure 2D:
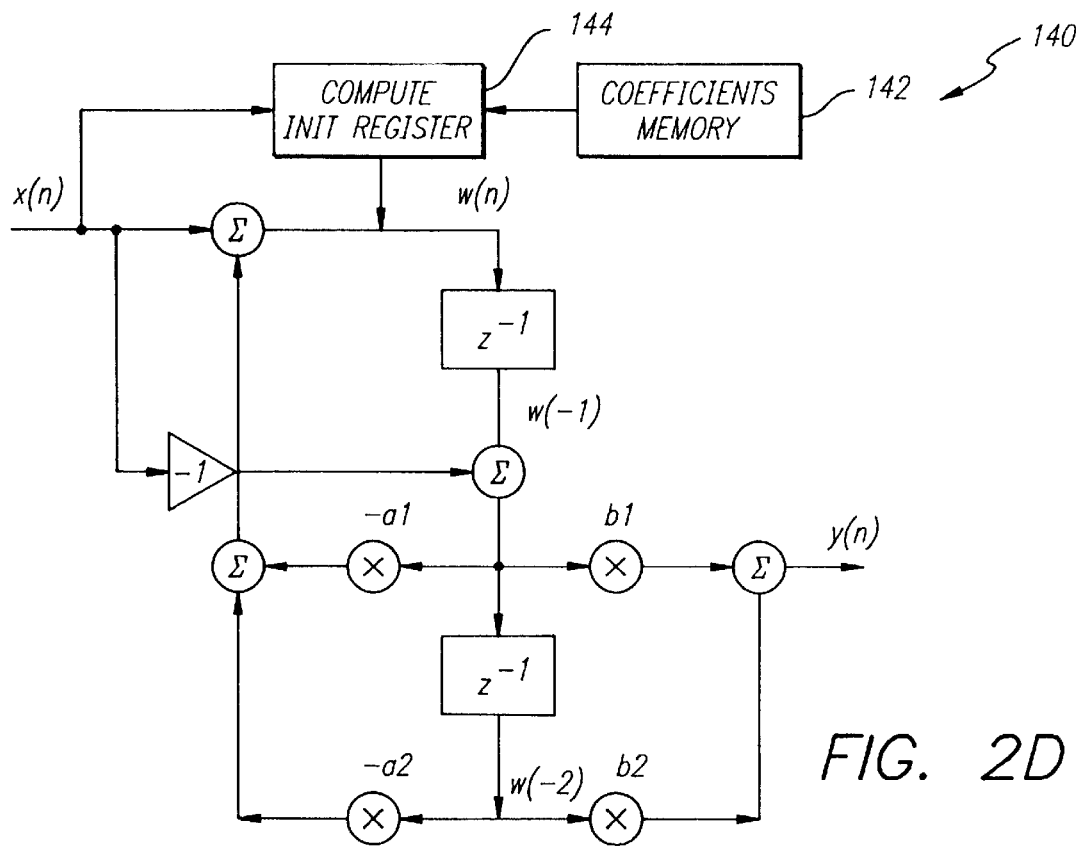
FIG. 2D illustrates a digital filter according to the present invention that is optimized to remove low frequency artifacts.

The IIR filter of the present invention is shown in FIG. 2D. The filter 140 has the same configuration as the filter shown in FIG. 2B with the addition of a memory 142 that stores the filter coefficients a and b that are precomputed given the filter parameters and a processor 144 that computes initial values for $w_k(-1)$ and $w_k(-2)$. The initial values for $w_k(-1)$ and $w_k(-2)$ are computed from a sequence of m samples of the input signal x(n) and loaded into the filter equations before the filter begins to operate. Given the correct coefficients a, as determined by the desired filter characteristics, the values $w_k(-1)$ and $w_k(-2)$, are computed using Equation 9 with the exception that coefficient matrices of Equation 10 are changed to:

$$A_i = \begin{bmatrix} b_{1i} \\ 1 \end{bmatrix}, B_i = \begin{bmatrix} -a_{1i} & -a_{2i} \\ 1 & 0 \end{bmatrix}, C_i = \begin{bmatrix} 1 + a_{1i} \\ -1 \end{bmatrix} \quad (11)$$

and coefficients $b_{1i}$, $b_{2i}$ are now $-1$ and 1, respectively.

As will be appreciated by those skilled in the art, the projection initialization method set forth in Equation 9 requires a matrix inversion where the matrix $F^T F$ is an m×m matrix with coefficients depending on the specification of the IIR filter. For a high-order filter with a very small cut-off frequency (e.g., 0.8% of the ultrasound pulse repetition frequency), this matrix has eigenvalues close to zero such that its inversion is highly unstable.

In the presently preferred embodiment of the invention, the matrix inversion is computed using a Singular Value Decomposition (SVD) with regularization. The matrix, $F^T F$, has a SVD $$F^T F = U W V^T \quad (12)$$

where U and V are orthogonal and $W = \text{diag}(w_1, w_2, \ldots w_n)$ where $w_1 \geq w_2 \geq \ldots \geq w_n \geq 0$ are the singular values of $F^T F$. The inverse of $F^T F$ is, therefore, $$(F^T F)^{-1} = V[\operatorname{diag}(1/w_i)]U^T \tag{13}$$

From Equation 13, it is clear that a very small $w_j$ results in an unstable matrix inversion due to a dominated round-off error. This situation could be improved by adding the concept of regularization. Regularization imposes a weak smoothness constraint on the possible solutions. In the presently preferred embodiment of the invention, the identity matrix is applied as the regularization matrix so that the singular values $w_j$ will become:

$$w_j = w_j + \alpha/w_j \tag{14}$$

where $w_n \leq \alpha \leq w_1$. The constant $\alpha$ is selected by the minimum singular value, i.e., $\alpha = w_n$.

The projection initialization method of defining the values $w_k(-1)$ and $w_k(-2)$ requires a leading segment of m samples of the input signal. In the past there has never been any consistent method for determining how many samples should be used. However, it has been discovered that the minimum number of samples, m, required for good filter performance depends on the filter specifications such as the level of passband ripple, the cut-off frequency and the order of the filter. For a given filter, the coefficients $a_1$ and $a_2$ used in the filter of FIG. 2C are related to the position of the filter poles, $P = re^{\pm j\theta}$, with $a_1 = -2r \cos\theta$ and $a_2 = r^2$.

In the projection initialization method, the transient response needs to be minimized and can be restricted to a two-dimensional space (for a second-order system) for the vector decomposition only if m is sufficiently large such that $r^m$ is small. The term $r^m$ can therefore be written in terms of the filter coefficient $a_2$ as:

$$a_2^{\frac{m}{2}} \leq \gamma \tag{15}$$

where $0 < \gamma < 1$ is defined as a decay constant. A small $\gamma$ always reduces the oscillation near the resonant frequency, i.e., reduces the passband ripple. For the purpose of the present invention, a new constant $\beta$ is defined as $\beta = \max_{1 \leq k \leq s} a_{2k}$ (i.e., the maximum $a_2$ coefficient used in the filter) where s is the number of sections in a cascading IIR filter. Therefore, the minimum number of samples required for initialization is:

$$m \geq 2 \frac{\ln\gamma}{\ln\beta} \tag{16}$$

In practice, the $\gamma$ value is selected on a trial and error basis. For example, several $\gamma$ values such as 0.2, 0.3, 0.4, 0.6 may be selected. Once the filter characteristics such as its order and cut-off frequency have been determined, the filter coefficients can be determined. Given the value of $\gamma$ selected and the filter coefficients, the optimum number of samples to use in computing the values $w_k(-1)$ and $w_k(-2)$ is determined according to Equation 16. Next, a computer simulation of the filter is performed to determine the performance of the filter and the passband ripple. The computation of the filter's average output magnitude frequency response is well known. A pair of sinusoidal signals (i.e., sin and cos sequences) with N samples of varying frequencies of a are applied to the filter and the integrated sum of the N samples is normalized and recorded for each frequency. The passband ripple level can then be estimated by the mean value of the amplitudes in the frequency response curve for frequencies larger than the cut-off frequency. This simulation is repeated for each $\gamma$ value selected until an acceptable filter operation is obtained. Once $\gamma$ has been determined, the optimum number of points m needed to initialize the filter is stored and does not need to be recalculated unless the filter parameters change.

Because the wall filter according to the present invention is initialized using a set of m initial data values, the filter will not perform optimally to remove low frequency clutter for an indefinite period of time. Therefore, the filter must be periodically re-initialized to ensure its maximum performance. There are generally three possibilities for updating the filter. The particular embodiment used depends in large part on the available computer processing power of the ultrasound system in which the filter is used.

Figure 3A:
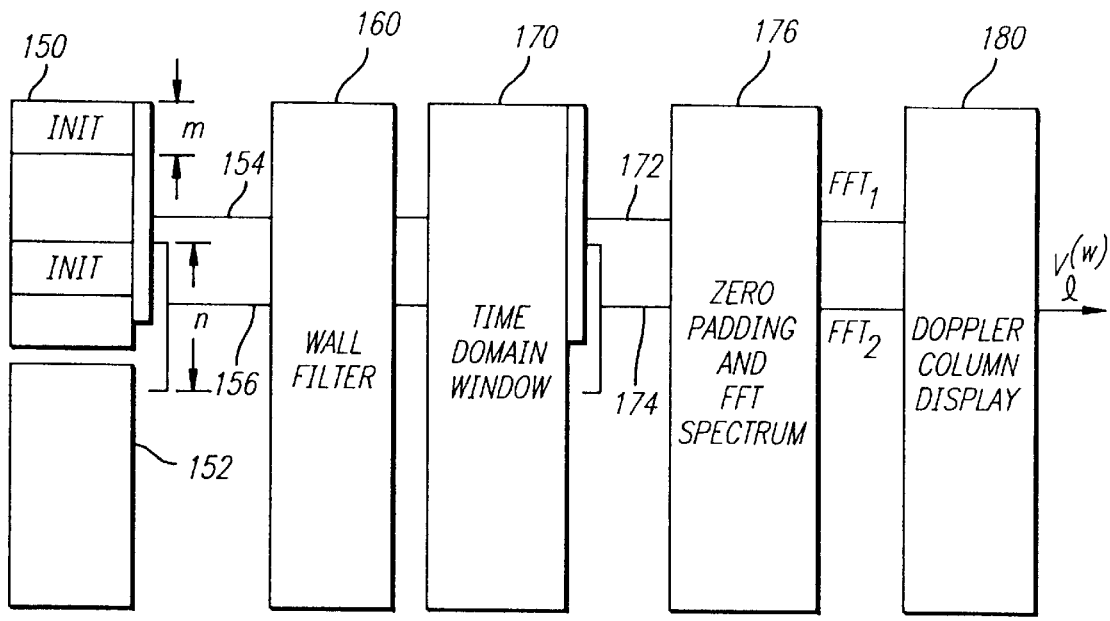
FIGS. 3A–3D illustrate three alternative embodiments for periodically re-initializing the digital wall filter of the present invention.

FIG. 3A shows the optimal method of re-initializing the values $w_k(-1)$ and $w_k(-2)$. Most ultrasound systems provide blocks of raw echo data to the ultrasound system at a rate equal to the vertical sync rate of the ultrasound display. Each block is therefore referred to as a Vsync data block. In the first embodiment, two Vsync data blocks 150 and 152 are received from the input stage of the ultrasound system. Two or more overlapping segments 154, 156 of the Vsync data are extracted and filtered by a digital wall filter 160 to create a single video line on a corresponding Doppler image.

The digital wall filter used to filter the extracted segments 154 and 156 is optimized for each segment. For example, the digital filter used to filter the segment 154 is optimized by calculating the values $w_k(-1)$ and $w_k(-2)$ from the first m samples of the segment 154. Similarly, the digital filter used to filter the segment 156 is optimized from the first m samples of the segment 156.

After filtering, the two data sets are applied to a time domain window function 170 whereby segments of the filtered data are weighted using a pair of Hanning windows or similar scaling functions to de-emphasize the beginning and end of the filtered data sets. Two segments of the weighted data 172 and 174 are applied to a FFT spectrum analyzer 176 that creates a pair of fast fourier transforms, $FFT_1$ and $FFT_2$, that are applied to a Doppler column display 180 where they are combined to create a single video line in the Doppler image.

As indicated above, although the system shown in FIG. 3A is optimal, it requires significant processing power to reconfigure the digital wall filters for each segment of Vsync data to be analyzed.

A second embodiment of the invention re-initializes the digital filter used to filter the ultrasound data each time a new video line is produced. Here, two Vsync data blocks 190, 192 are received from the input stage of the ultrasound system. Two or more overlapping segments 194, 196 of the data are extracted and applied to a digital wall filter 198 whose characteristics are set by using the first m samples of the data in the first segment 194. The two sets of data are therefore filtered using the same filter.

After filtering, the data are applied to a time domain window 200 where segments of the filtered data are weighted using a Hanning window or similar scaling function. Two segments of weighted data 202, 204 are then applied to an FFT analyzer 206. The FFT analyzer 206 produces two FFTs that are applied to a Doppler column display 208 that combines the FFTs to produce a single video line in the Doppler image.

Figure 3B:
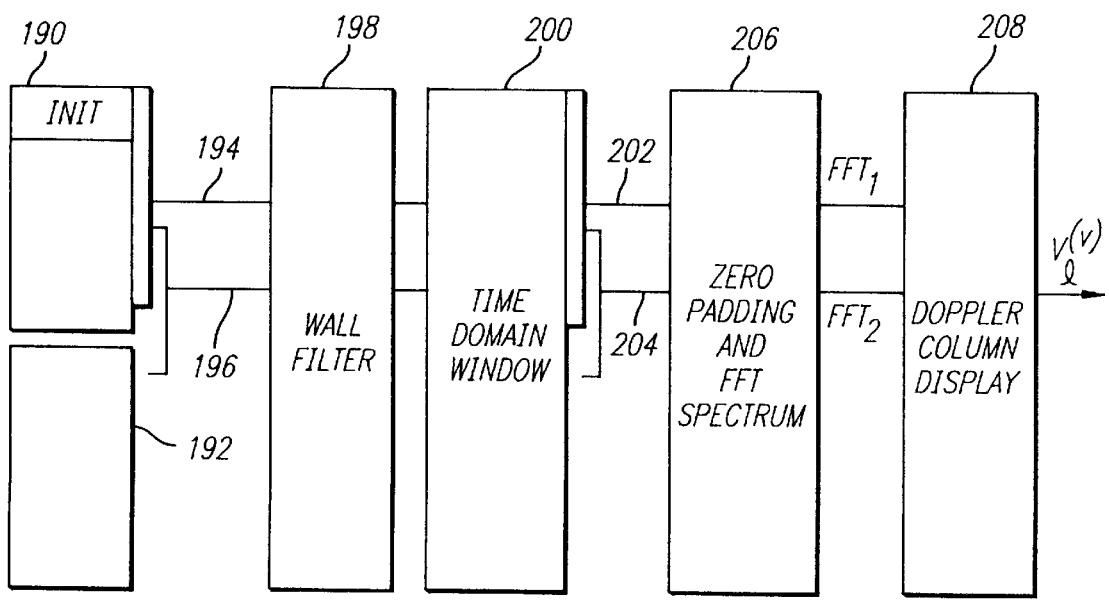

After the video line is produced, the digital filter 198 is re-initialized from the first m samples of the next Vsync data block. The system shown in FIG. 3B require less computation power than that of FIG. 3A but is not as effective in removing the wall artifacts from the corresponding Doppler image.

Figure 3C:
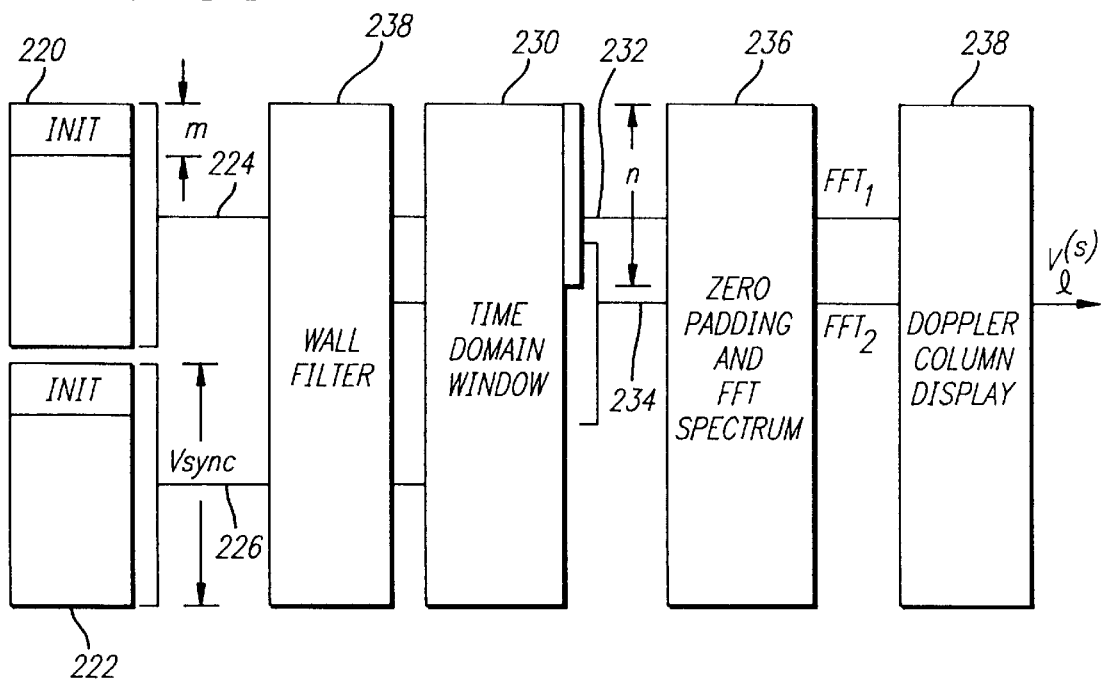

A third embodiment of the invention, shown in FIG. 3C, re-initializes the digital wall filter after each time block of Vsync data is received. For example, two blocks of Vsync data 220 and 222 are received from the input stage of the ultrasound system. Two segments 224 and 226 having a length equal to the entire sets of the Vsync data are filtered using a digital wall filter 224 that is initialized from the first m samples of the Vsync data block 220 and the first m samples of the Vsync data block 222, respectively. The output of the digital wall filter 228 feeds a time domain window 230 that extracts two or more weighted, overlapping segments of the data using a Hanning window. The two or more overlapping segments 232, 234 each have a number of samples equal to the number of samples used to compute a fast fourier transform. Each segment 232, 234 is applied to an FFT analyzer 236 that produces two fast fourier transforms that are combined in Doppler column display 238 to produce a single video line. In the embodiment of FIG. 3C, the wall filters used to filter each block of Vsync data are re-initialized each time a new block of Vsync data is received.

Figure 3D:
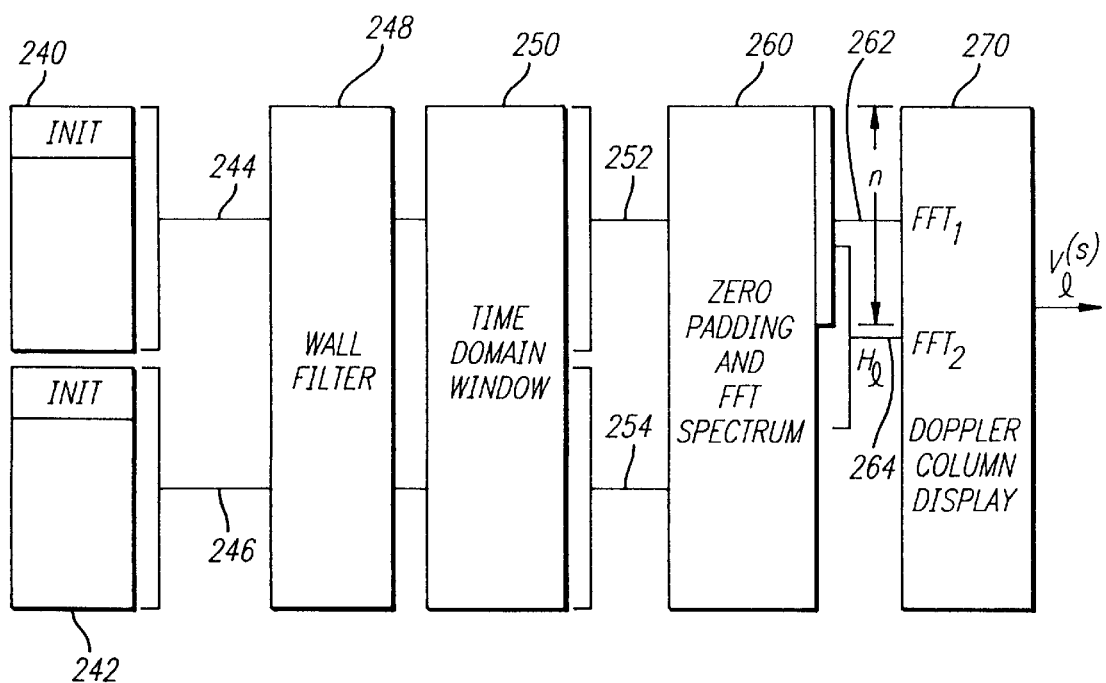

An alternative version of the embodiment shown in FIG. 3C is shown in FIG. 3D. Again, a pair of Vsync data blocks 240, 242 are received from the input stage of the ultrasound system. Two segments of data 244 and 246 are filtered with a pair of digital wall filters 248 that are initialized from the first m samples of each Vsync data block. The filtered data is then applied to a time domain window 250 that weights and extracts segments of the filtered data using a Hanning window to de-emphasize the beginning and end of the data block. From the time domain window, two non-overlapping segments 252, 254 of data having a number of samples equal to the size of the Vsync data block are extracted. These segments are applied to an FFT analyzer 260 that extracts portions of the weighted data to compute two or more overlapping FFTs that are combined in a Doppler column display 270 to produce a single video line.

The difference between the embodiment shown in FIG. 3D and that of FIG. 3C is that in the embodiment shown in FIG. 3C, the output of time domain window function 230 only weights a sequence of data equal in length to the number of samples used to compute the corresponding FFTs. In contrast, the output of the time domain window 250 shown in FIG. 3D weights a set of data equal in size to the block of Vsync data.

The embodiments shown in FIGS. 3C and 3D are easy to implement because the wall filter needs only be re-initialized each time a new Vsync data block is received. However, the inventors have determined that such a system is not as efficient in removing low frequency wall artifacts from a Doppler image as are the embodiments shown in FIGS. 3A and 3B.

Because the digital wall filter is initialized from the first m samples of the input signal x(n), the FFT data created with the first m samples will be more accurate than those created from subsequent data. To compensate for this effect, those FFTs created without using the first m samples of the input data are averaged with the FFT data that is created from the first m samples. Several methods described below can be used for averaging. However, it has been determined that the weighted log averaging methods are generally superior.

For notational convenience, the log of the FFT data for Doppler column 1 is defined as $\tilde{H}_l^{(0)}(p) = \text{Log}(H_l^{(0)}(\vec{x}_i; \vec{x}_j)_p)$ where $H_l^{(0)}$ represents the first vector which always includes sampling data for initialization computation. The term $x_i$ represents the data used to initialize the filter and the term $x_j$ represents the data that may or may not include the m samples used to initialize the filter. The index p represents a point in the FFT data.

The first method of averaging the filtered data is to use a conventional linear average computed according to the formula:

$$V_l(p) = \frac{1}{K} \sum_{k=0}^{K-1} H_l^{(k)}(\vec{x}_i; \vec{x}_j)_p \qquad (17)$$

where K is the number of FFTs used to create a single video line. The linear averaging is a straightforward averaging based on the linear scaling of the FFT data. This method is also called Welch's split-spectrum method to reduce the variance of the estimated spectrum. The inventors have discovered that this method is not particularly effective in emphasizing the data used to initialize the wall filter.

The second method averages the logarithms of the filtered data computed by the formula:

$$V_l(p) = \text{Log}^{-1}\left[\frac{1}{K}\sum_{k=0}^{k-1} \tilde{H}_l^{(k)}\right] \qquad (18)$$

In the log averaging method, the filtered data are taken logarithmically first and summed to one video vector. The final vector will be changed back to the linear scaling for further processing.

In the averaging of the Doppler spectrum vectors, it is assumed that the Doppler frequency (i.e., the peak of the spectrum vector) induced from the blood flow is a constant for the averaged vectors so that the averaging process could reduce the spectrum noises. Under this assumption, the log averaging is more efficient to suppress the noise because the log function dominates the smaller value than the larger one. For example, the log averaging of 0.01 and 0.1 0.032 which is 5 dB below the linear averaging of 0.055. Other operators could also dominate the smaller number in averaging; for example, the square root could also be used. However, using the above example, the square root averaging of 0.01 and 0.1 is 0.04333 which is only 2 dB below the linear averaging. In practice, the log operation can be implemented by a look-up-table to reduce the complexity of the computations required.

The third method of averaging utilizes an adaptive logarithmic average that is computed according to the equation:

$$V_1(p) = \text{Log}^{-1}\left\{\frac{1}{K-1}\sum_{k=1}^{k-1}\left[\tilde{H}_1^{(0)}\left(1 - \frac{\gamma_k}{\alpha_k}\right) + \tilde{H}_1^{(k)}\frac{\gamma_k}{\alpha_k}\right]\right\} \qquad (19)$$

where $\alpha_k = \max(-\tilde{H}_l^{(0)}(p), -\tilde{H}_l^{(k)}(p))$, $\beta_k = \min(-\tilde{H}_l^{(0)}(p), -\tilde{H}_l^{(0)}(p), -\tilde{H}_l^{(0)}(p), -\tilde{H}_l^{(k)}(p))$ and $\gamma_k = \min(\alpha_k - \beta_k, \beta_k)$. The adaptive log averaging can be extended to be adaptive in the sense of dominating the first FFT data created using the m initialization points. This FFT data is called the reference vector and should be the best among the other averaging vectors because the reference vector determines the initialization coefficients of the wall filter.

In Equation 19 it is assumed that the maximum value of the filtered data is less than one, i.e., within the dynamic range of the data length which has been normalized to one. From Equation 19, it is clear that the averaging is the interpolation of the reference vector and its following vectors. The interpolation constant is a function of the reference and the current vectors, for example, the adaptive log averaging of 0.001 (the reference data) and 0.1 is 0.0046 which is 7 dB below the log averaging, 0.01, and 21 dB below the linear averaging, 0.0505.

The last method of averaging the data uses a weighted average that is computed according to the equation:

$$V_1(p) = \begin{cases} \text{Log}^{-1}\left[\frac{1}{2}\tilde{H}_1^{(0)} + \frac{1}{2(K-1)}\sum_{k=1}^{K-1}\tilde{H}_1^{(k)}\right] & \text{data includes the reference vector,} \\ \text{Log}^{-1}\left[\frac{1}{2}\tilde{H}_1^{(0)} + \frac{1}{2K}\sum_{k=1}^{K}\tilde{H}_1^{(k)}\right] & \text{otherwise.} \end{cases} \quad (20)$$

The adaptive log averaging of Equation 19 is a strong averaging biased to the reference vector. However, the weighted log averaging of Equation 20 is the one between the log averaging of Equation 18 and the adaptive log averaging of Equation 19. This weighted log averaging is useful when the digital wall filter is reinitialized every time a block of Vsync data is received.

In Equation 20, the value $V_1(p)$ is computed in two different ways depending on whether the averaged vectors include the reference vector. The reference vector is loaded to the averaging process. This is always the case when the Doppler columns are computed with a SweepRate (i.e., the number of video lines created for every Vsync pulse) of larger than one. Therefore, Equation 20 is different from Equation 18. K=2 (i.e., the number of vectors for averaging is two), even when the SweepRate is larger than one, e.g., needs more than one Doppler columns from one Vsync. Moreover, Equation 20 is really doing K+1 averaging in the case of $K \geq 2$ and SweepRate>1.

For three vector values of 0.001, 0.01 and 0.1, the weighted log averaging of them is 0.0056 which is 5 dB above the adaptive log averaging, 0.003, but 5 dB below the log averaging, 0.01, and 16 dB below the linear averaging, 0.037. The spectrum broadening effect becomes negligible if the main lobe width at the Doppler frequency induced from the blood flow is much smaller than the transit time bandwidth at that frequency. For the re-initialization techniques described above, the reference vector used for averaging shows much better resolution at the Doppler frequency compared with other averaged vectors because the initialization coefficients were computed from this reference vector. Therefore, the spectrum broadening effects by using the proposed log-based averaging methods could be reduced.

As will be appreciated by those skilled in the art, if any of the second, third, or fourth averaging methods are used, it is necessary to take the inverse of log (i.e., the power of 10) of the final vector to have a linear scaling.

Figure 4:
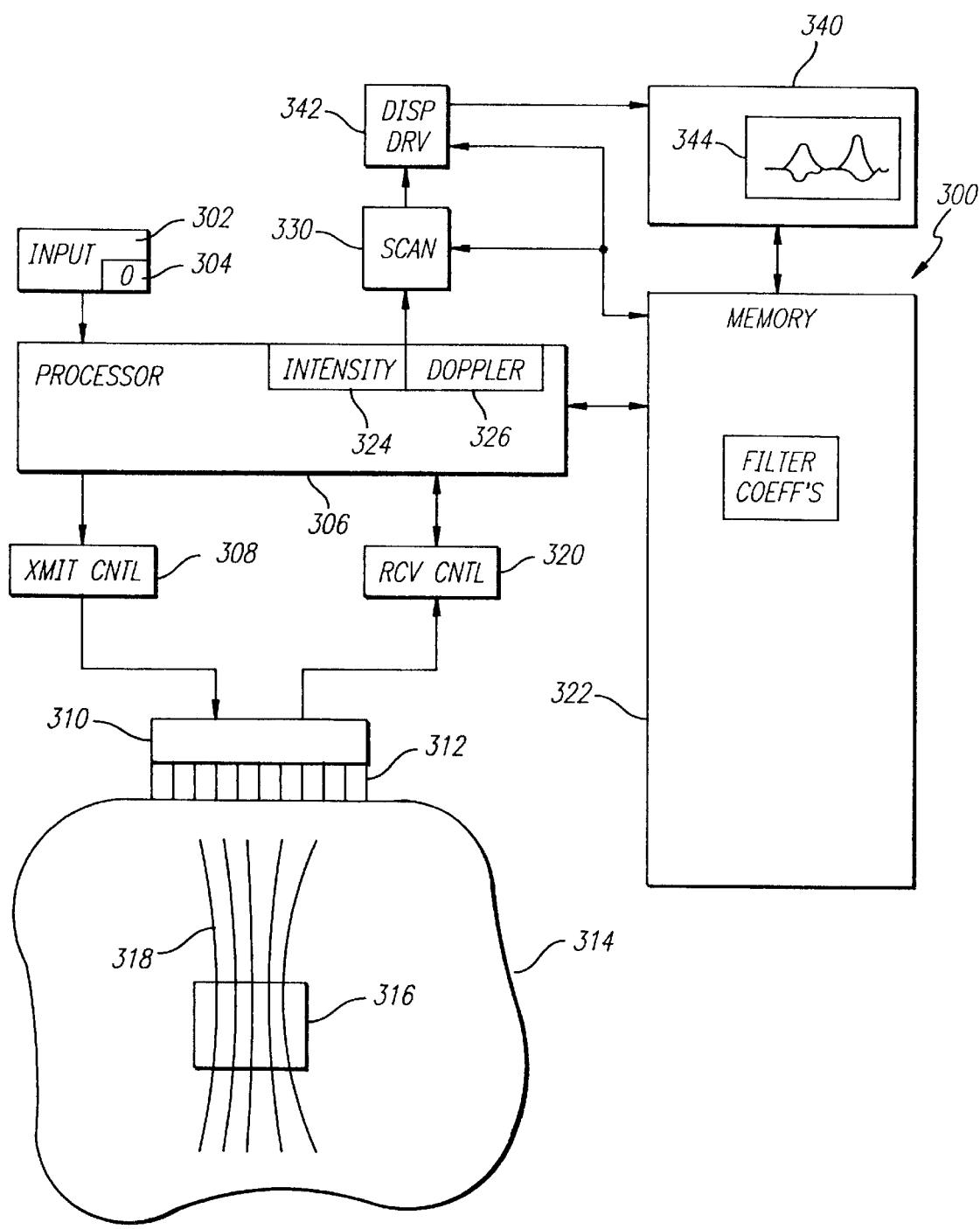
FIG. 4 is a block diagram of an ultrasound system in which the present invention is used.

FIG. 4 illustrates the main components of an ultrasonic imaging system in which the present invention is used. The user enters various conventional scan parameters into an input unit 302 that typically includes such devices as a keyboard 304, knobs, and buttons. The input unit is connected to a processing system 306, which will typically be an electrically connected and cooperating group of processors such as microprocessors and digital signal processors. The processing system may, however, be implemented as a single processor provided it is powerful enough to perform the computational tasks described below.

The processing system 306 sets, adjusts, and monitors the operating parameters of a conventional transmission control circuit 308. This control circuit generates and applies electrical control and driving signals to an ultrasonic probe 310, which includes an array of piezoelectric elements 312. As is well known in the art, the piezoelectric elements generate ultrasonic waves when electrical signals of the proper frequency are applied to them.

By placing the probe 310 against the body 314 of the patient, ultrasonic waves enter an interrogation region 316 of the patient's body. By varying the phasing, amplitude and timing of the driving signals in a conventional manner, the ultrasonic waves are focused to form a scan beam comprising a series of scan lines 318 that typically fan out from the probe.

In most common applications of ultrasonic scanning, the interrogation region 316 is scanned as a pattern of 2-D planes in order to generate 2-D information, such as a spatial map of the intensity of the echo signals returned from the interrogation region, or a 2-D map of the velocity of the tissue moving within the region. Other techniques using both one and two dimensional ultrasound arrays are known that allow scan beams to lie in different planes and thus generate 3-D representations of the scanned region and to sense flow within three independent velocity components. The manner in which ultrasonic scanning signals are controlled, generated, and applied to the patient's body are well known in the art and therefore need not be described in further detail.

Ultrasonic echoes from the waves transmitted into the body return to the array 312 in the probe 310. The piezoelectric elements in the array convert the small mechanical vibrations caused by the echoes into corresponding radio-frequency (RF) electrical signals. Amplification and other conventional signal conditioning is then applied to the returned signals by a reception controller 320. This processing includes such signal conditioning as time-gating, gain compensation, and diffraction compensation in order to identify the echo signals that correspond to each scan plane of the interrogation region 316. The type of conventional signal processing needed will in general depend upon the particular implementation of the invention and can be chosen using known design methods.

The reception controller 320, all or part of which is normally integrated into the processing system 306, converts the ultrasonic radio frequency return signals into a lower frequency range for processing and may also include analog-to-digital conversion circuitry.

In systems that generate a representation of the interrogation region as a pattern of brightness or signal intensity values, the down converted power values for the two-dimensional interrogation region are stored in a memory 322 as frame data after conventional beam forming. An intensity determining portion 324 of the processing system 306 may be included to perform the conventional calculations necessary for relating returned echo signal strengths to a predetermined range of intensity values.

The Doppler shifts and/or power Doppler spectra for the various echo signals are also determined with necessary conventional calculations being performed in a Doppler/velocity determining portion 326 of the processing system 306. Using the known techniques, the Doppler/velocity determining portion 326 calculates velocity vectors for each portion of the interrogation region 316 to produce the Doppler display image.

Each frame of the image to be displayed is stored as an array of acoustic power, intensity or velocity vectors for the image elements that make up a frame. These values are stored in the memory 322. Each set of frame data corresponds to one image frame.

The interrogation region 316 is normally not the same shape as the user wants to see displayed. The digital acoustic intensity values that make up the frame data are normally not in a form suitable for driving a conventional gray-tone or colored display. The acoustic values or velocity values for an image frame are therefore applied to a conventional scan converter 330 which converts the values into display intensity values suitable for use in driving a display device 340.

The display device 340 typically includes or is connected to a conventional display driver 342 and includes a screen 344 (for example, an LED or CRT) that is divided into an X-Y (or polar) matrix or pattern of picture elements or "pixels" that make up an image that the user can view and interpret. The displayed image element will often be made up of more than one pixel, but this will depend upon the relative resolution of the scan and of the display.

The digital filter used to eliminate the low frequency wall artifacts from the Doppler image is implemented by the processor 306. The processor 306 stores the input signal received from the receiver controller 320 and stores it within the memory 322. After computing the number of samples m to initialize the digital filter, the feedback and feedforward coefficients of the filter are retrieved from the memory 322 and the filter then operates on the received echo data in the manner described above.

As can be appreciated, the present invention is a digital wall filter that is optimized to remove low frequency clutter based on an initialization of the first m samples of an input ultrasound signal. The filter is periodically re-initialized to insure its optimum performance. Finally, the results of the filtering are averaged with the output of the filter for the first m samples to further improve the artifact suppression.

The embodiments of the invention in which an exclusive property or privilege is claimed are defined as follows:

1. A method of producing a Doppler ultrasound image with reduced artifacts caused by moving artery or muscle walls, comprising:

receiving a set of digitized ultrasound echo data;

analyzing a sequence of m samples of the digitized ultrasound echo data to initialize a second order infinite impulse response digital filter of the type having a number of feedback coefficients that are related to the poles of the filter, wherein the number m is selected as being greater than a ratio of $\ln y/\ln \alpha$, where y is a constant selected between 0 and 1, and $\alpha$ is a largest feedback coefficient of the filter;

applying the set of digitized ultrasound echo data to the initialized digital filter;

computing one or more spectra from the filtered ultrasound data; and displaying the one or more spectra as the Doppler ultrasound image.

2. The method of claim 1, wherein the one or more spectra are computed by calculating a fast Fourier transform on a set of the digitized ultrasound echo data, the method further comprising:

re-initializing the digital filter from a set of m samples before each fast Fourier transform is calculated.

3. The method of claim 1, wherein the Doppler ultrasound image is comprised of a series of video lines, the method further comprising:

re-initializing the digital filter after each video line in the Doppler ultrasound image is displayed.

4. The method of claim 1, wherein the digitized ultrasound echo data is received in blocks of data at a rate equal to a vertical sync rate of the ultrasound system, the method further comprising:

re-initializing the digital filter upon the receipt of each block of ultrasound echo data.

5. The method of claim 1, further comprising:

averaging the one or more spectra created from the filtered ultrasound echo data, wherein the average is weighted in favor of the spectra created from the first m samples that are used to initialize the digital filter.

6. An ultrasound system comprising:

an ultrasound probe that directs ultrasonic signals into a patient's body and receives returned echo signals from the patient's body;

a processor that receives the echo signals and analyzes the signals to compute a Doppler shift of the echo signals, the processor including a digital filter having a set of feedback coefficients that are related to the poles of the filter, the filter further including means for storing initialization coefficients that are determined from a set of m samples of the returned echo signals, wherein the number m is selected to be greater than a logarithmic ratio of a constant y, that is selected between 0 and 1, and a largest feedback coefficient in the filter, the filter operating to remove low frequency artifacts caused by movement of muscle or arterial walls in the patient from the returned echo signals; and a display device that displays an image of the Doppler shift of the filtered echo signals.

* * * * *